(12) United States Patent
Pulver

(10) Patent No.: US 6,455,770 B2
(45) Date of Patent: Sep. 24, 2002

(54) ELECTROMAGNETIC RADIATION SHIELD FOR ATTENUATING ELECTROMAGNETIC RADIATION FROM AN ACTIVE ELECTRONIC DEVICE

(76) Inventor: Lee J. Pulver, 116 Via Lago, Los Gatos, CA (US) 95030

( * ) Notice: Subject to any disclaimer, the term of this patent is extended or adjusted under 35 U.S.C. 154(b) by 0 days.

(21) Appl. No.: 09/784,849

(22) Filed: Feb. 15, 2001

Related U.S. Application Data

(63) Continuation of application No. 08/887,959, filed on Jul. 3, 1997, now abandoned.

(51) Int. Cl.[7] .................................................. H05K 9/00
(52) U.S. Cl. ................. 174/35 MS; 428/620; 428/621
(58) Field of Search ................. 174/35 MS, 35 R; 361/816, 818, 800; 428/620, 621

(56) References Cited

U.S. PATENT DOCUMENTS

| | | | |
|---|---|---|---|
| 4,647,714 A | * | 3/1987 | Goto .............................. 174/36 |
| 4,749,625 A | * | 6/1988 | Obayashi et al. ............ 428/624 |
| 4,896,001 A | | 1/1990 | Pitts et al. ............... 174/35 MS |
| 4,978,812 A | | 12/1990 | Akeyoshi et al. ....... 174/35 MS |
| 4,980,223 A | | 12/1990 | Nakano et al. .............. 428/198 |
| 4,980,564 A | | 12/1990 | Steelmon .................. 250/505.1 |
| 5,557,064 A | | 9/1996 | Isern-Flecha et al. .. 174/35 MS |
| 5,574,249 A | | 11/1996 | Lindsay ..................... 174/35 R |
| 5,889,316 A | | 3/1999 | Strobel et al. ............... 257/659 |

OTHER PUBLICATIONS

J.Kraus; D.Fleisch; "Electromagnetics with Applications"; *McGraw–Hill*; Fifth Edition, Chapter 2—Electric And Magnetic Fields; pp. 35–118; 1999 (No Month).

J.Kraus; D.Fleisch; "Electromagnetics with Applications"; *McGraw–Hill*; Fifth Edition, Chapter 5—Antennas, Radiation, And Wireless Systems; pp. 247–356; 1999 (No Month).

C.Paul, K Whites, S.Nasar; "Introduction to Electromagnetic Fields"; *McGraw–Hill*; Third Edition, Chapter 9—Antennas; pp. 583–647; 1998 (No Month).

* cited by examiner

*Primary Examiner*—Hung V. Ngo
(74) *Attorney, Agent, or Firm*—Lyon & Lyon LLP

(57) ABSTRACT

A shield for attenuating the strength and density of electromagnetic radiation emitted by electronic components includes two parallel conductors separated by an insulator. The shields are installed on the surface of electronic components by an adhesive.

6 Claims, 14 Drawing Sheets

ELECTROMAGNETIC RADIATION SHIELD FOR ATTENUATING ELECTROMAGNETIC RADIATION FROM AN ACTIVE ELECTRONIC DEVICE

CROSS-REFERENCE TO RELATED APPLICATION

This application is a continuation of Ser. No. 08/887,959, filed Jul. 3, 1997, abandoned.

SPECIFICATION

1. Field of the Invention

The present invention relates in general to reduction of stray electromagnetic radiation emissions produced by electronic systems and more specifically to apparatus for shielding stray electromagnetic radiation.

2. Background of the Invention

Electronic systems (e.g., electrical circuits, etc.) which operate on alternating current ("AC") or direct current ("DC") voltage generate an electromagnetic field. An electromagnetic field is comprised of waves. Such fields are created because of the electrical energy being used in the devices. In most countries, agencies like the Federal Communications Commission (FCC) in the United States, Industry Canada (ICAN) in Canada, and Bundesamt Fur Post Und Telekommunikation-Zulassen Und Testen (BZT) in Germany regulate maximum amplitudes for radiated and conducted electromagnetic energy permissible at specific frequencies.

Unintentional radiators include electronic systems such as personal computers and computer networking hardware. Intentional radiators include electronic systems such as transmitters and regenerative receivers. This is by no means an exhaustive list of unintentional and intentional radiators, as various other electronic systems produce unwanted stray electromagnetic radiation emissions. Such unwanted electromagnetic radiation includes radio frequency, electrostatic and magnetic fields. As the operating speeds of these electronic systems increase, the strength of the electromagnetic fields increase. For example, present personal computers can operate at speeds above two hundred megahertz ("MHz"). These operating speeds will only increase in the future.

Stray electromagnetic fields are highly undesirable, as they can cause interference with other electronic devices, radio frequency communications systems, etc. Because of this, governmental agencies of many agencies have issued regulations which specify the maximum amplitude of stray unwanted electromagnetic radiation that an electronic system can emit and still be used in that country. If a product does not meet these specifications, it cannot be sold in that country.

Each of the government agencies has specific testing methodologies. In general, the stray electromagnetic radiation of an electronic system is measured using an antenna placed at least three meters from an electronic system on a calibrated test site. The field strength per meter of the stray fields is measured. In general, stray fields have strength with an order of magnitude in the one hundred microvolts range when the frequency is between thirty MHz and eighty-eight MHz. When recorded field strength exceeds the limit imposed by agencies such as the FCC, the electronic system must be redesigned so that it complies with those specifications. Electronic system redesign and implementation into production can delay product introduction by several months.

At present, a common method to reduce the stray electromagnetic energy produced by an electronic system is to encase the electronic system in a continuous metal enclosure. If there are no seams in an enclosure, then electromagnetic energy is contained since a Faraday Cage has essentially been built around the electromagnetic energy source. When designing such an enclosure, the amplitude and frequency of the stray electromagnetic field determines its thickness. Regardless of the thickness, however, the shielding properties of the enclosure are compromised if system being shielded has any input/output ports, data cables, displays, etc. that cannot be shielded. Because of this, additional shielding must usually be added to the enclosures, cables, displays, keyboards, etc. to assure compliance to the FCC recommendations. These additional technologies add significant product cost and development time, and detract from the cosmetics of a final product.

Summarizing, while effective, these enclosures are heavy, add cost, and reduce the appeal of the product, especially if it is intended for the consumer market. Furthermore, it is entirely possible that this shielding might not even be necessary. Thus, a product could be designed with such shielding, thereby greatly adding to its cost, when the shielding was not even necessary.

In addition, in an attempt to make products that are more attractive and/or less expensive, the electronics industry also uses plastic enclosures. If an electronic system operating inside a plastic enclosure exceeds electromagnetic interference limits allowed by the regulatory agency, a metallized surface may be applied to the plastic enclosure in attempt to transform the interior of the plastic enclosure into a metal enclosure. The cost of this technology can be prohibitive, however, because the top and bottom sections of the enclosure must exhibit electrical continuity at the seams, while maintaining a uniform thickness over the entire enclosure surface. This is difficult to achieve.

Another common method for reducing stray electromagnetic radiation is to change the location of components in an electronic system. For example, a designer might change the location of the system's crystal oscillator to place it closer to the circuit receiving the signal. This will reduce the length of the signal path (i.e., the connecting wire or printed circuit board trace) and therefore might reduce the stray electromagnetic radiation emitted. The problem with this particular method is that it requires a redesign of the electronic system. This increases the cost of the product and significantly delays the product from entering the market. In addition, there is no way of knowing if the redesign actually worked until it is retested. When it is retested, the redesigned product may still exceed the specifications for maximum stray electromagnetic radiation. Many times, a third redesign must be undertaken. This costs time and money.

Examples of the specifications for the maximum stray electromagnetic radiation that a product must satisfy to be sold in the United States include:

| FREQUENCY (MHz) | dB microvolt/meter (dB $\mu$V/m) | microvolt/meter ($\mu$V/m) |
|---|---|---|
| 30 to 88 | 40.00 | 100 |
| 88 to 216 | 43.50 | 150 |
| 216–960 | 46.00 | 200 |
| 960–1000 | 54.00 | 500 |

These specifications, which have been issued by the FCC as of the filing date of this application, are measured from a position three meters from the electronic system undergoing test.

Examples of specifications that are in force in Europe include:

| FREQUENCY (MHz) | dB microvolt/meter (dB µV/m) | microvolt/meter (µV/m) |
|---|---|---|
| 30–230 | 40.46 | 105.44 |
| 230–1000 | 47.46 | 236.05 |

These are also measured at a distance of three meters from the electronic system undergoing test. These three meter limits are mandated in the specification EW 55022/CISPR 22, which is entitled "Limits and Methods of Measurement of Radio Disturbance Characteristics of Information Technology Equipment."

Furthermore, according to the newest European criteria, many products must continue to operate and be less susceptible to a field of three volts per meter from twenty-seven MHz to five hundred MHz to be allowed entry into the marketplace for sale. This is known as susceptibility. These criteria for susceptibility is best represented by the following product standards:

IEC 801-2 Electromagnetic Compatibility for Industrial-Process Measurement and Control Equipment. Part 2: Electrostatic Discharge Requirements. 1984

IEC 801-3 Electromagnetic Compatibility for Industrial Process Measurement and Control Equipment. Part 3: Radiated Electromagnetic Field Requirements. 1984

IEC 801-4 Electromagnetic Compatibility for Industrial Process Measurement and Control Equipment. Part 4: Electrical Fast Transient. 1988.

An example of an electronic system that is particularly prone to producing stray fields is a laptop computer system. Prior to being marketed for sale or being sold, a laptop computer system must be tested by a FCC registered testing laboratory. The product must comply with the Code of Federal Regulations, Title 47, Part 2 entitled Frequency Allocations and Radio Treaty Matters; General Rules and Regulations; and Part 15 entitled Radio Frequency Devices, Oct. 1, 1996 edition. If the product does not pass this testing, it cannot be marketed for sale or sold. Laptop computer systems represent a fast paced electronic system technology that must be introduced into the market quickly. If the laptop computer system fails the testing described above, it must be redesigned prior to sale, thereby resulting in delay. Delay in releasing the product to the market can result in obsolescence before the first unit is sold. The testing and redesign stage of product compliance can sometimes be the critical path for product or company success Compounding the above-described problems is that when designing electronic systems, it is difficult to predict the type and amount of stray fields that will be created; Because of this, designers either design their product without these radiation reducing features and accept the risk of product delays should the product fail testing, or implement potentially unnecessary field control structures (e.g., a metal enclosure). However, product delays can be fatal for many products, as time-to-market is extremely important in the modem marketplace. This is especially true in the electronics market. For example, technology and consumer tastes for personal computers generally change within a matter of months. If a product must be redesigned before it can be sold, it probably will never be sold. On the other hand, unnecessary field control structures increase the product's cost, thereby increasing the chance for the product's failure in the marketplace.

Thus, there has been a long felt need for an inexpensive apparatus that reduces stray electromagnetic radiation of products without requiring a product redesign or heavy shielding.

SUMMARY OF THE INVENTION

The present invention overcomes the problems and disadvantages of the prior art through a unique electromagnetic radiation shield. A shield or tab is disclosed. The shield of the present invention comprises a first conductive layer and a second conductive layer separated by an insulator. In a preferred embodiment, the first conductive layer and second conductive layer comprise a flexible aluminum alloy. The insulating layer of the preferred embodiment comprises a fibrous material that is bonded to the first conductive layer and second conductive layer by paraffin-based glue. The second conductive layer has an adhesive on the exterior thereof for affixing the shield or tab to a component that emits unwanted electromagnetic radiation. If desired, the first conductive layer can have a material applied to the exterior thereof that allows printing images thereon.

The various embodiments of the present invention are installed on the surface of electronic devices that are emitting unwanted electromagnetic radiation. If during testing, a product emits unacceptable amplitudes and/or frequencies of eletromagnetic radiation, measurements can be taken in the vicinity of the electronic components installed therein. The shields of the present invention can be installed on the surface of selected electronic components of the apparatus in the field. Then the product can be immediately retested.

Selection of the electronic components that will have the shields of the present invention installed therein varies from apparatus to apparatus. In some applications, the shields can be placed only on those components exhibiting unacceptable electromagnetic radiation performance. In other cases, the shields of the present invention will be placed on several components of the apparatus.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

DETAILED DESCRIPTION OF THE DRAWINGS

Turning to the figures, the presently preferred apparatus and methods of the present invention will now be described.

Figure 1:
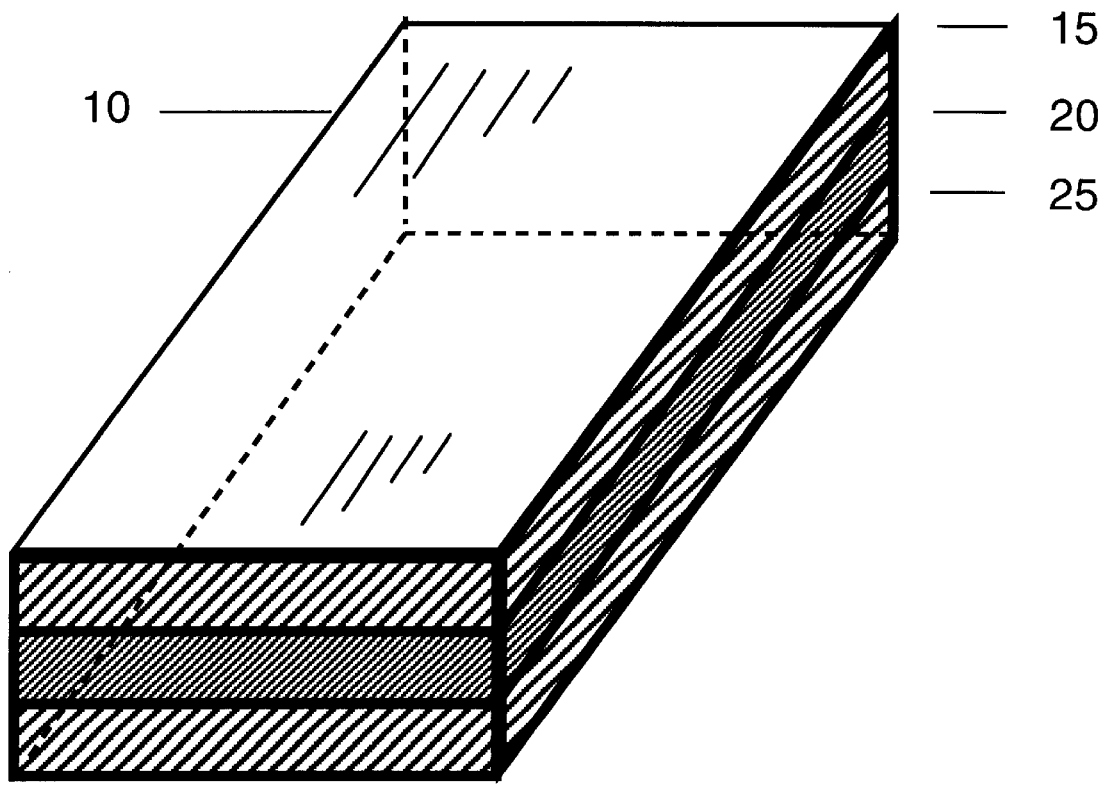
FIG. 1 is a perspective, section view of a stray electromagnetic shield of the present invention.
Figure 2:
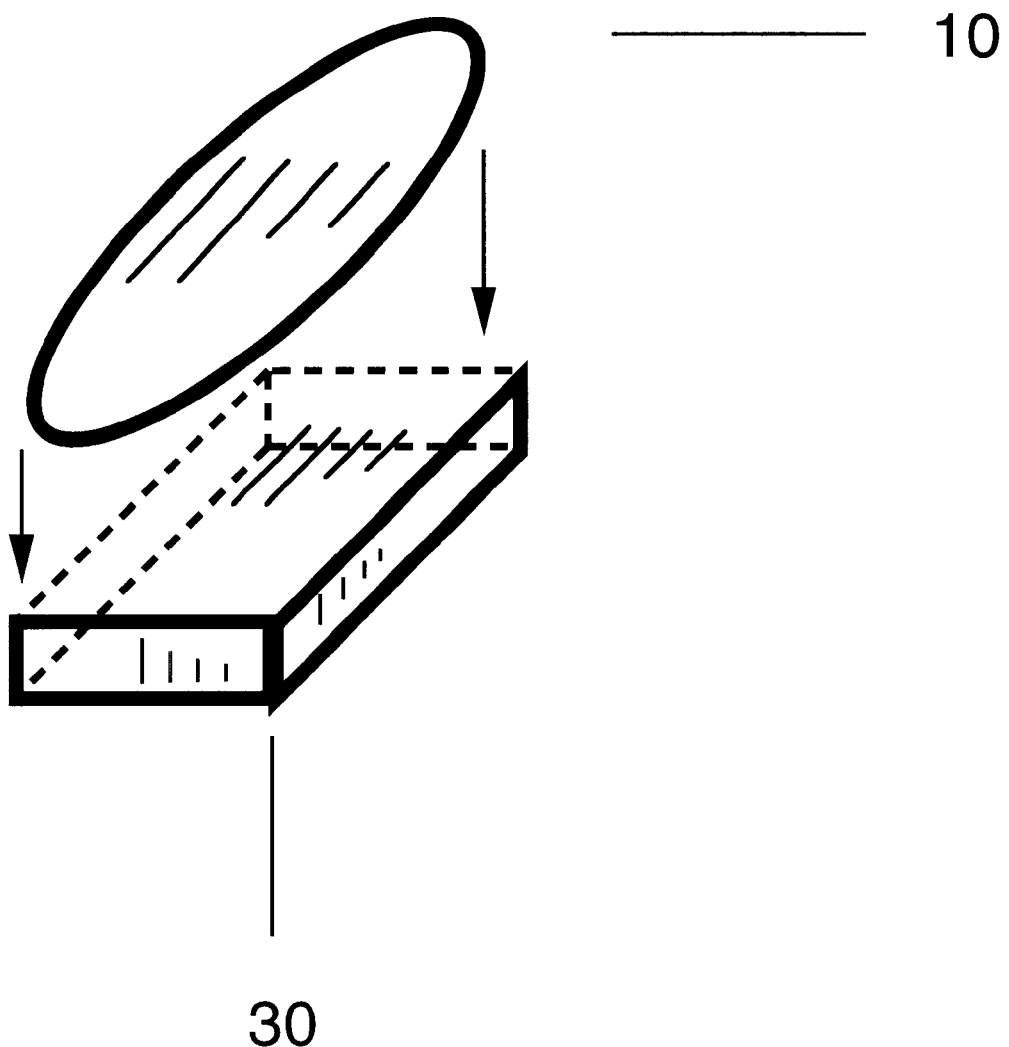
FIG. 2 is a perspective view of a stray electromagnetic shield of the present invention being affixed to an electronic device.

With reference to FIG. 1, sectional view of an exemplary shield 10 of the present invention is shown. The shield 10 of the present invention is comprised of a first conductive layer 15, an insulating layer 20, and a second conductive layer 25. In use, the shield 10 is affixed to the top of a package of an electronic component 30, as shown in FIG. 2 and as will be described below. Such a component could be an integrated circuit (e.g., a microprocessor), an oscillator, a power supply, etc.

Figure 3:
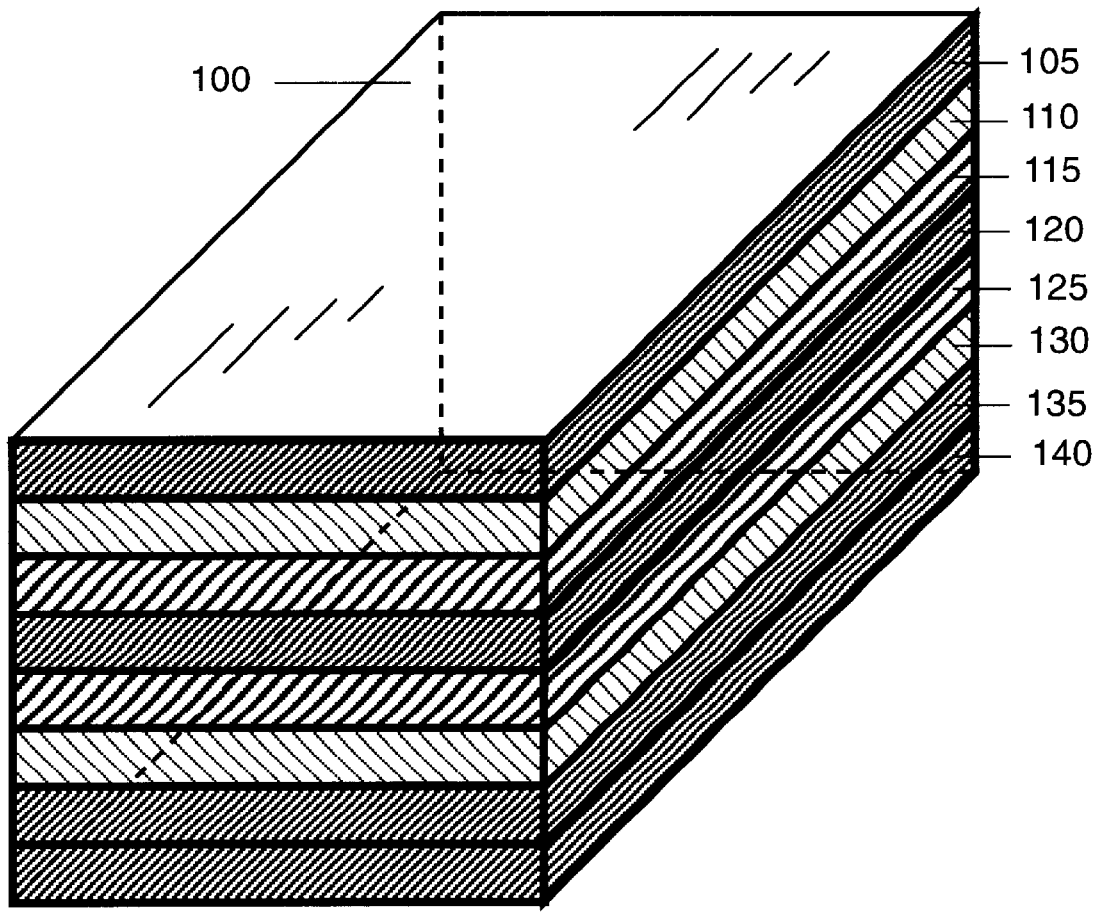
FIG. 3 is a perspective, section view of a presently preferred stray electromagnetic shield of the present invention constructed in accordance with the teachings of the present invention.

With reference to FIG. 3, a sectional view of a presently preferred embodiment 100 of the present invention is shown. The topmost layer 105 of the shield 100 can comprise a polyester material which can have information printed thereon. This topmost layer 105 can also be a lacquer type material facing outward toward the operating environment. Information can be printed on the shield with any type of ink compatible with the material used on the topmost layer. This information could display, for example, identifying information such as the part number and manufacturing location of the component which will have the shield affixed thereto. In the presently preferred embodiment, layer 105 comprises a one hundred eighty degrees Centigrade, 0.0102 millimeter thick, gold-colored liquid lacquer coating that is applied directly to the first conductive layer 110 (see discussion of first conductive layer 110 below). This material is chosen because ink can be applied thereon during a high speed printing process without smearing. It is noted that powder-type lacquers will not provide satisfactory results.

Below the outermost layer 105 is a first conductive layer 110. First conductive layer 110 can be constructed of any material that can conduct the electromagnetic field radiated by the electronic device which has the shield 100 mounted thereupon. In the presently preferred embodiment, the conductive layer 110 comprises a 0.0254 mm thick aluminum alloy comprised of 99.51% aluminum, 0.35% silicon, 0.60% iron (as fume), 0.10% copper (as fume), 0.05% manganese (as fume), 0.05% magnesium, 0.01% chromium, 0.10% zinc (as fume), and 0.03% titanium. Such a layer can be obtained from the Consolidated Aluminum Corporation (Part Nos. 1050, 1100, 1145, 1200, 1235, 1250, 1270, 1285, and 1350) or the Alcan Aluminum Corp. (Part Nos. 1025 to 1500).

Aluminum alloy is used in the presently preferred embodiment for the following reasons. First, it has low cost. Second, it can be purchased in large sheets. For example, in a presently preferred method of manufacturing the present invention, these sheets have dimensions of twenty-eight inches wide by one thousand feet long. Third, it is flexible. Fourth, it is highly resistant to environmental conditions typically seen by electronic components. Fifth, it can be easily cut to specific sizes. Sixth, aluminum alloy has performance characteristics that are well suited for this application. Specifically, a typical stray electromagnetic field that exceeds the specifications discussed below radiates when the circuit is operating above thirty MHz. The aluminum alloy used in the presently preferred embodiment is conductive to stray fields at frequencies above approximately thirty MHz. It is noted that other conductive materials may be used. The only limiting factor is that the first conductive layer must conduct electromagnetic fields.

In a presently preferred embodiment, the insulating layer 20 is actually comprised of three different layers 115, 120, 125. First insulating layer 115 is comprised of a semiconductor material. In a preferred embodiment, this semiconductor material is paraffin-based resin glue. This material is chosen because it is possible to align the molecules of the semiconductor material such that when it is exposed to an electromagnetic field, the charge of the dielectric will increase, which will increase the electrostatic potential of the electromagnetic radiation between the conductive plates 110, 130. The molecules of this material are aligned as follows: During the manufacturing process, the paraffin-based material is subjected to magnetic field while the material is in a semi-fluid state. When the material solidifies, the molecular structure tends to be aligned and corresponds to the previous polarized magnetic field. Second insulating layer 120 is comprised of a fibrous material. In presently preferred embodiments, this fibrous material can be sixty-pound paper, one hundred twenty-pound paper, or ten-point paperboard. Third insulating layer 125 is comprised of the same material as the first insulating layer 115.

It is important to note that the insulating layer 20 can be comprised of materials other than those described. The purpose of the insulating layer is to electrically isolate the first conductive layer 15 from the second conductive layer 25. Any material that is capable of doing this can be used for the insulating layer 20.

Below insulating layers 115, 120, 125 is second conductive layer 130. Second conductive layer 130 is preferably comprised of the same material as first conductive layer 110. Below the second conductive layer 130 is an outer layer 135. Outer layer 135 is preferably constructed with the same materials as outermost layer 105. Below outer layer 135 is an adhesive layer 140. Adhesive layer 140 is used to affix the shield 100 to the electronic component upon which the shield is mounted. Adhesive layer 140 is preferably comprised of model no. 966 adhesive available from the Minnesota Mining & Manufacturing Corporation. However, any adhesive that is not water-soluble, has high resistance to heat, and will maintain adhesion over the life of the product would provide satisfactory performance. Furthermore, the surface energy of the electronic component surface must be compatible with the adhesive characteristics of layer 140. A peel-away layer (not shown) covers the adhesive layer 140 until it is time to install the shield 100 on the electronic component. When it is desired to install the shield 100 of the component, the peel-away layer is removed from the adhesive layer 140 and discarded.

The method of manufacturing the presently preferred shield 100 will now be discussed. The shield is constructed using sheets of the materials that comprise layers 105, 110, 115, 120, 125, 130, 135, 140, which result in the manufacturing of strataform panels. The desired size of the strataform panels is determined and the individual sheets of the materials that form each layer are cut to the selected size. For example, as discussed, the various layers can be purchased in rolls of 1000 feet by 28 inches. These rolls are cut into press sheets depending on the nominal size of the shield. Press sheets could be eight and one-half by eleven inches, for instance, or ten by twelve inches, depending on how many shields can be extracted from each sheet. The layers are placed together, back-to-back, with the paraffin-based glue which will form the first insulating layer 115 and second insulating layer spread evenly over the interior portions of the aluminum alloy sheet forms. The sandwich is laminated using any typical laminating machine or laminating station. The purpose of the laminator is merely to combine the sheet material into a strataform panel containing multiple layers. It is noted that if outermost layer 105 and outer layer 135 do not comprise the polyester material discussed above, it can be applied by merely spraying the surface of the outer portion of the sheet forms which will form the first conductive layer 110 and second conductive layer 130 with lacquer, resin or PTFE (such as Teflon® brand PTFE). The result of this process is that strataform panels are created.

An adhesive sheet is then placed on the side of the strataform panel opposite the printed surface of the outermost layer 105. This adhesive sheet has adhesive on both sides. One side attaches to the outer layer 135 while the other side is used when installing the shield 100 onto an electronic component. As discussed above, the finished shield product has a peel-away-layer on the adhesive that is removed at the time of installation. The final product with the polyester on one side and the adhesive on the other is in sheet form After the strataform panels are created, artwork is printed onto the topmost layer 105. The artwork includes the actual shield outline and information that will remain on the shield surface (e.g., part number and manufacturer's name). In the presently preferred method, the artwork will be silk screened onto the surface. A laminate (not shown in the Figures) can be placed on the printed surface after the printing is completed. A typical laminate would be polyester film, measuring 0.001 in. This film virtually eliminates the possibility of the artwork being scratched. Although used primarily for cosmetics, such a laminate also contributes to the reduction of unwanted electromagnetic emissions. This is due to the dielectric properties of the polyester film. A laminator known to those skilled in the art is used to place this polyester film on the surface.

The sheet forms are cut into the actual shields 100 by using either a steel rule die or Class A die mounted in a clam shell press. Cutting of the shields 100 from the sheets is a critical step, as they must be cut in a fashion that will prevent the first conductive layer 110 from being in physical and electrical contact with second conductive layer 130. This is important because the first and second conductive layers 110, 130 interact with each other to either absorb or reflect the stray electromagnetic fields (as will be discussed below). If the first and second conductive layers 110, 130 were to contact each other, a short circuit would be created, which would prevent the shield 100 from working properly. In the presently preferred method of cutting the shields 100 from the sheet, a clam shell press is used. Such a press ensures that the first conductive layer 110 and the second conductive layer do not physically contact each other.

The shape of each shield 100 is important to its performance. Preferably, the shield will not have any corners. However, the shield can have any shape and provide satisfactory performance. It can be oval, rectangular, curvilinear and circular.

Figure 4:
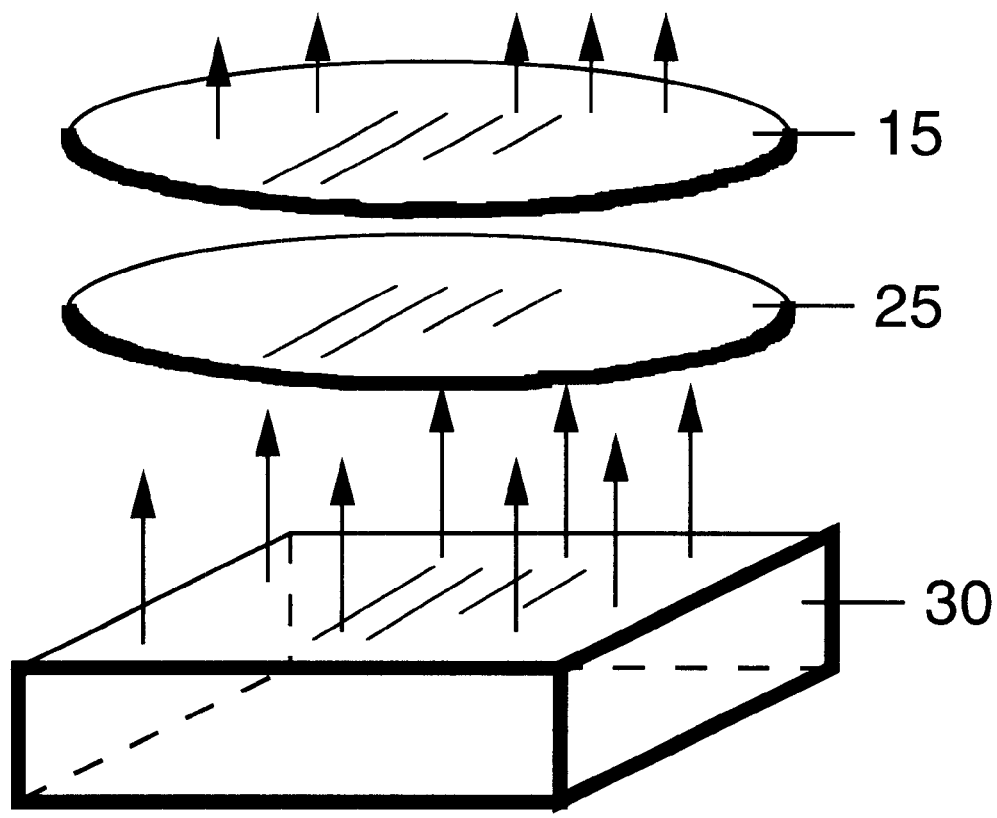
FIG. 4 is a simplified drawing showing an effect of the stray electromagnetic shield of the present invention.

With reference to FIGS. 4-8, the manner in which shield 10 attenuates unwanted electromagnetic emissions will be discussed. Shield 10 actually induces several different mechanisms for collapsing the stray electromagnetic field created by an electronic device. It is noted that in FIGS. 4-8, the dielectric layer 20 is not shown, while the first conductive layer 15, the second conductive layer 25, and the electronic device 30 are shown separated from each other. This is done for illustrative purposes only and is not intended to limit the scope of the invention. The first and most basic of the mechanisms the present invention utilizes to attenuate the stray electromagnetic field emitted from electronic device 30 is shown in FIG. 4. When an electronic device 30 is emitting stray electromagnetic fields, many of the waves comprising the field are directed perpendicular to the package. The arrows in FIG. 4 represent the waves being emitted perpendicular to the electronic device 30. In the basic mechanism shown in FIG. 4, both the first conductive layer 15 and the second conductive layer 25 absorb some of the waves of the electromagnetic field emanating from the electronic device 30. Thus, each conductive layer 15, 25 attenuates the strength of the unwanted electromagnetic field.

Figure 5:
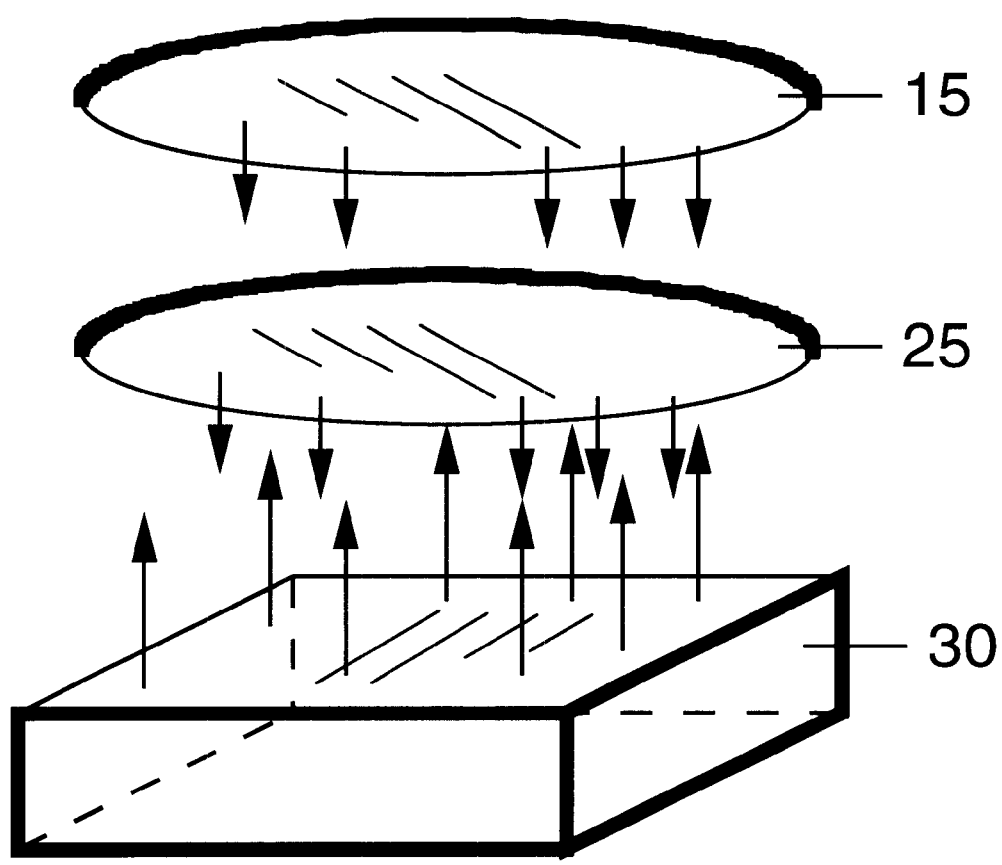
FIG. 5 is a simplified drawing showing an effect of the stray electromagnetic shield of the present invention.
Figure 6:
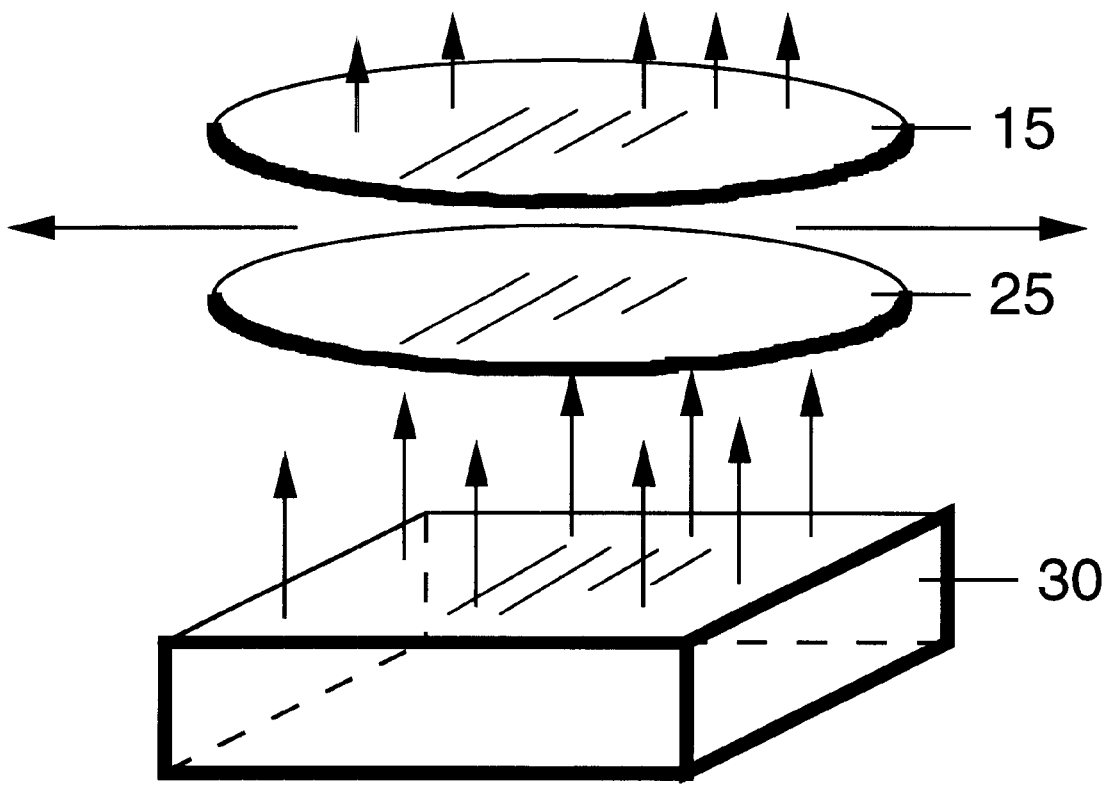
FIG. 6 is a simplified drawing showing an effect of the stray electromagnetic shield of the present invention.
Figure 7:
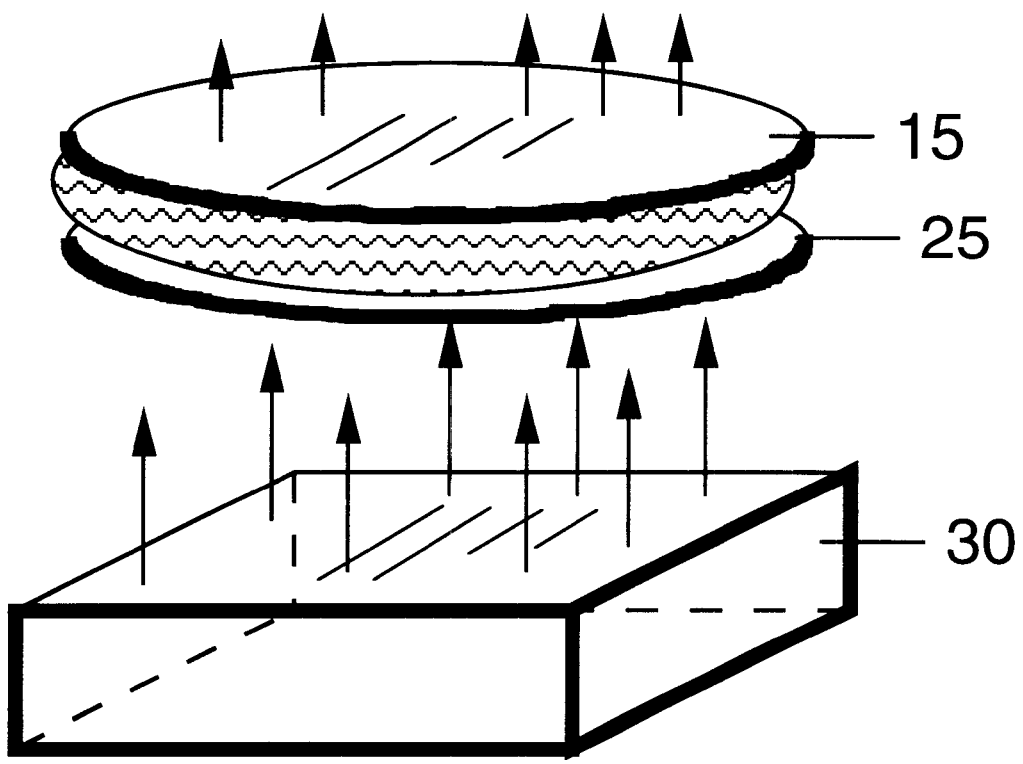
FIG. 7 is a simplified drawing showing an effect of the stray electromagnetic shield of the present invention.

The second mechanism of the invention for collapsing the stray electromagnetic field is shown in FIG. 5. As seen in FIG. 5, in addition to acting as a shield, both the first conductive layer 15 and second conductive layer 25 act as antennas and reflect some of the waves of the field back towards the source of the unwanted electromagnetic radiation. Thus, second conductive layer 25 reflects some of the waves of the field from electronic device 30 back towards electronic device 30. The electromagnetic field reflected by second conductive layer 25, through interference, cancels out some of the unwanted emissions. Likewise, first conductive layer 15 reflects some of the waves of the field that passed through second conductive layer 25 back towards insulating layer 20 (not shown in FIG. 6) and the second conductive layer 25.

The second conductive layer 25, the insulating layer 20 and the first conductive layer define a wave guide. This causes electromagnetic field to emit perpendicular to the original unwanted emissions. The field emitted perpendicular to the original unwanted emissions is seen by the arrows in FIG. 6. The reason for this is as follows. The two conductive planes of the shield allow electromagnetic energy to reflect between them. Plane transverse electromagnetic mode waves result in a higher order transverse electric mode. The transverse electric mode wave will not be transmitted unless the wavelength is sufficiently short. Their critical wavelength, at which the transmission is no longer possible, is called the cut off wavelength. The cut off wavelength as a function of sheet spacing is the wavelength of the electromagnetic waves between the first conductive layer 15 and second conductive layer 25 divided by four.

However, the longest wavelength which can be transmitted between the sheets in a higher order mode (i.e., a higher order harmonic of the electromagnetic waves between the first conductive layer 15 and second conductive layer 25) is determined by Lambda=2 B, where B is equal to the distance between the two conducting planes. Because the two conducting planes create a resonating cavity, the energy from this resonance is directed to the edges, since there is more energy in the center of these two planes than there is on the edges. Furthermore, it is not just the parallel planes themselves that cause electromagnetic energy to emit from the sides of the shield 10, but also the dielectric sheet wave guide effect, whereby the transverse electromagnetic wave is launched into the sheet from reflections between the two conductive layers.

In addition to directing the waves of the field perpendicular to the original unwanted emissions, the waves of the field reflected off of the first conductive layer 15 reflect back and forth between the first conductive layer 15 and second conductive layer 25, i.e., the waves resonate. With the field resonating between the first conductive layer 15 and the second conductive layer 25, the magnitude of the electrostatic potential of the field that passes through the first conductive layer 15 and into the environment attenuates. This is because the waves of the field resonating between the first conductive layer 15 and the second conductive layer 25 interfere with, i.e., cancels, the waves of the stray electromagnetic field that emanate from the electronic device 30.

Figure 8:
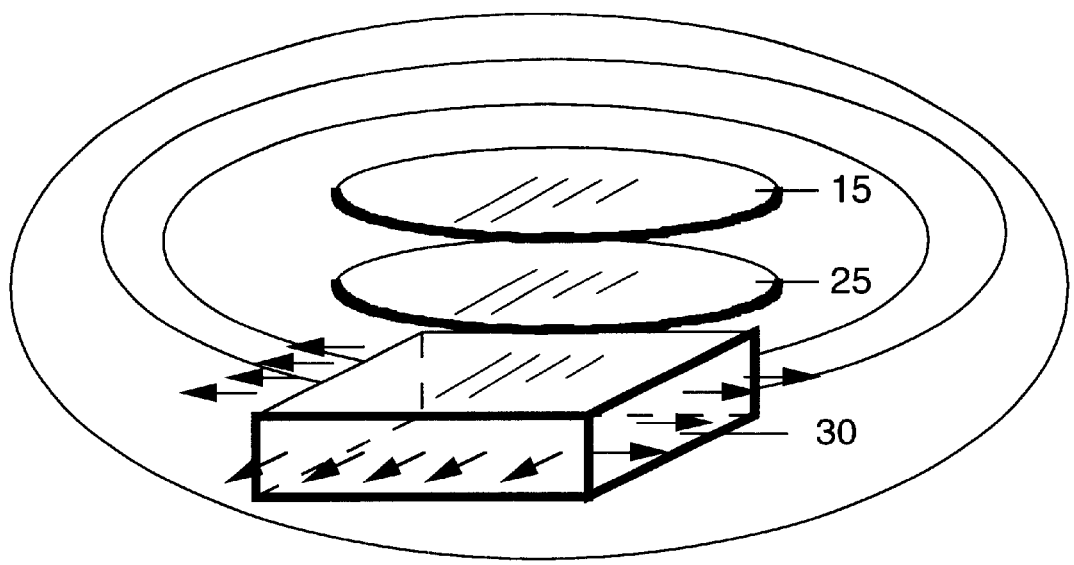
FIG. 8 is a simplified drawing showing an effect of the stray electromagnetic shield of the present invention.

Electronic devices also emit a magnetic field that envelops the sides of the electronic devices. This is seen in FIG. 8. The shield 10 of the present invention also reduces this field. However, it is important to properly install the shield 10 onto a device because the shield 10 actually creates a field of its own. If the field created by the shield 10 becomes too great, it could adversely affect the operation of the electronic device upon which it is mounted.

The various methods in which the shields 10 of the present invention are installed will now be discussed. When a digital device such as a computer system is being tested on a FCC registered test site, the tests discussed above are performed. This test site has a receiving antenna that is connected via special cable to a spectrum analyzer. The digital device undergoing testing is placed in the center of a rotating table that is located three meters from the antenna. The rotating table is rotated by remote electronic control until the antenna receives the maximum amplitude of specific frequencies of the stray electromagnetic radiation that is generated by the equipment under test. This information is displayed on the spectrum analyzer. If the amplitudes received by the antenna exceed the FCC limit, the shields 10 of the present invention are installed on specific electronic components (i.e., integrated circuits) of the equipment being tested. The test is then repeated to determine the effect that installing the shields 10 had on the unwanted emissions. If the amplitudes of the unwanted electromagnetic emissions continue to exceed the FCC limit, additional shields 10 may be installed to reduce the amplitudes to a value below the FCC limits.

To determine which electronic components to install the shields 10 of the present invention on, it must be determined where the unwanted stray electromagnetic emissions are being generated on the printed circuit assembly and how they are being distributed throughout the equipment. This is done by reviewing schematics, layout drawings and other technical references for the product undergoing testing. By doing this, the location where the excessive electromagnetic radiation is being produced can be located. Examples of "noisy" components that are likely sources for the unwanted emissions include multi-vibrators, crystal oscillators, collpits oscillators, and other oscillating components. Shields 10 of the present invention are then placed on all of the circuits closest to the likely source for the excessive emissions.

Another method of determining which specific electronic components should have the shields 10 of the present invention installed on is by the equipment's orientation. For example, the data cables that are connected to the input/output ports of the product undergoing testing may very well be located closer to the antenna at the time the maximum amplitude of the unwanted electromagnetic radiation is measured (as discussed, the product undergoing testing is mounted onto a turntable). To resolve this type of failure, the shields 10 of the present invention may be installed onto the electronic component used to interface with the input/output ports.

On the other hand, even if data cables are oriented such that they are facing the antenna, review of the schematics might show that the unwanted electromagnetic radiation is being generated by a microprocessor and/or associated circuitry on the printed circuit board driving the input/output port. In this situation, the microprocessor and associated interface circuitry will have a shield 10 of the present invention installed thereon.

The result of installing a shield 10 of the present invention onto a specific electronic component will be seen on the spectrum analyzer, as the reduction of the unwanted emission amplitude will be measured again by the calibrated antenna.

Typically, to access the electronic components PC boards of the product undergoing testing, a portion of the enclosure is removed. Typically, one or two shields 10 of the present invention are installed on electronic components in the vicinity of the determined sources of unwanted electromagnetic radiation. After the shields 10 are installed, portion of the enclosure which was removed is re-attached to the product. The RF energy would then be measured to see what the effect was. The reason that only one or two shields 10 are installed at a time is that installing too many shields 10 in a product may cause more unwanted emissions. Therefore, a step by step procedure must be used to ensure that the overall unwanted emissions of the device are reduced below acceptable limits Another method of determining which electronic components to install the shields 10 of the present invention will now be discussed. The product undergoing testing is characterized on a calibrated radio frequency interference test site between thirty and two hundred Mz in both the horizontal and vertical polarization. This means that the receiving antenna connected to the spectrum analyzer will be positioned in the vertical (with respect to the ground surface) orientation for one set of data, and horizontal (with regards to the ground surface) for the other set of data. Failure data is characterized by unwanted emissions having specific amplitudes exceeding the limit.

The product undergoing testing is then removed from the test site. The cover of the product is removed, and a high-speed oscilloscope (at least a 150 MHz) is adjusted so that a specific offending frequency of unwanted emissions, such as 80 MHz, can be seen readily on the scope face. Using the appropriate probe attached to the high-speed oscilloscope, the areas of the printed circuit assemblies of the product undergoing test where the unwanted emissions (e.g., the 80 MHz signal) appear on the scope face are located.

The spectrum analyzer connected to the calibrated antenna is adjusted such that its resolution bandwidth set to 100 kHz, its video bandwidth is set to 100 kHz, its frequency span set to 0 Hz, and its center frequency set to 80 MHz (for this particular example). The appropriate probe is connected to the spectrum analyzer so that when that probe is brought adjacent to the oscilloscope probe cable , the amplitude of the unwanted emission can be seen on the spectrum analyzer scope face. The specific electronic components where the amplitude of the unwanted emission (in this case, the 80 MHz signal) is at its highest are then found by moving the oscilloscope probe around the interior of the product undergoing testing. The shields 10 of the present invention are then installed on those specific components. If the location of the shield 10 is suitable for the application, the spectrum analyzer will show a definite decrease in the amplitude of the unwanted emissions.

At this point, the cover of the product is reinstalled, and the product is retested in accordance with the above-described specifications. It is important to note that prior to installing the shields 10 in the product for the first time, only the fundamentals and associated harmonics of the unwanted emissions should be measured. If the product undergoing testing fails again, then it should be determined whether the unwanted emissions are fundamentals or harmonics. If they are fundamentals, use the same techniques described above and install the shields 10 of the present invention on top of the electronic components and associated conducting pathways (i.e., metal circuit traces) on the PC board to decrease the RF energy on the PC board. Any harmonics that still are exceeding the unwanted emission levels can be reduced by analyzing "divide by" circuits or equivalent circuitry and applying RF disks to the associated integrated circuits.

The level of attenuation of the stray electromagnetic field and the density of the field created by the shield 10 varies as function of the size of the shield 10. A larger shield will attenuate the stray field more than a smaller shield. However, a larger shield will create a greater field density than a smaller shield. Thus, when installing a shield on an electronic device, it may be necessary to use a shield of one size, determine the attenuation, and verify that the electronic device still operates properly. If these parameters are not met, this shield can be removed, and a new shield of a different size can be installed on the electronic device.

The field created by the shield 10 also varies as a function of materials used to construct the shield. As discussed, in the presently preferred embodiments, the first conductive layer 15 and second conductive layer 25 are constructed of aluminum alloy. The first conductive layer 15 and second conductive layer 25, however, can be constructed of magnetic materials, therefore causing the shield 10 to interact more readily with magnetic fields in an operating environment. It is noted, however, that the aluminum alloy used for the first conductive layer 15 and second conductive layer 25 of the preferred embodiment interacts primarily with electric and electrostatic fields.

Figure 9:
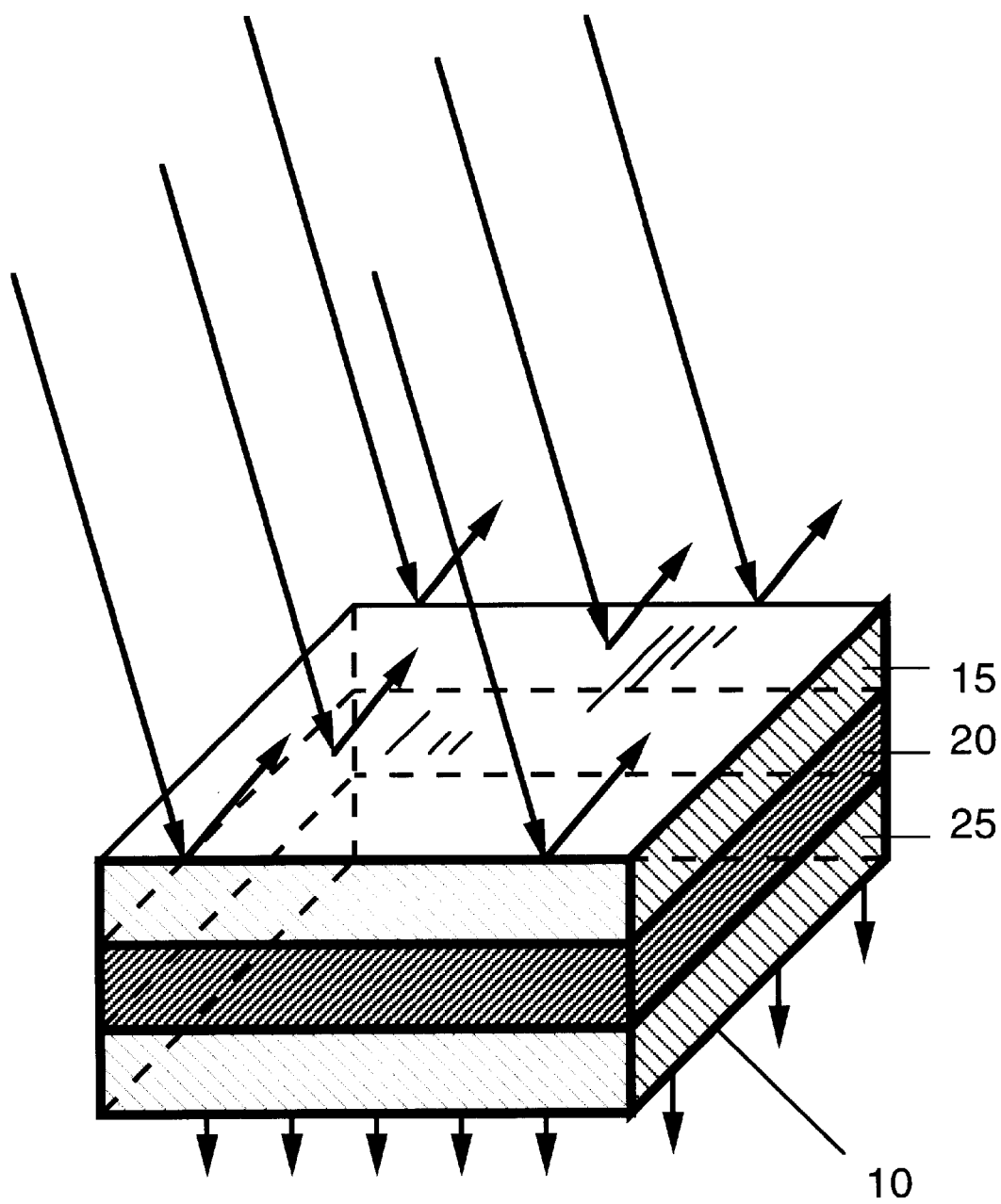
FIG. 9 is a simplified drawing showing an effect of the stray electromagnetic shield of the present invention.

In addition to preventing unwanted emissions of electromagnetic radiation, the apparatus of the present invention reduces an electronic device's susceptibility to external electromagnetic radiation. This is important because external electromagnetic radiation can disturb the operation of an electronic device. In addition, regulatory agencies such as those described above have either promulgated or are promulgating regulations regarding the susceptibility of electronic products to electromagnetic radiation. Examples of susceptibility regulations that have been promulgated by the European Community are discussed above. The manner in which the various embodiments of the present invention operate to reduce an electronic device's susceptibility to external electromagnetic radiation will be discussed with reference to FIG. 9. As seen in FIG. 9, external electromagnetic radiation (shown in FIG. 9 as arrows) can strike the shield 10 at any angle The manner in which the shield 10 prevents this radiation from reaching the electronic device 30 is similar to the manner in which the shield 10 collapses the stray electromagnetic field emitted by the electronic device 30. First, the first conductive layer 15 and the second conductive layer 25 absorb some of the waves of the external electromagnetic field. Thus, each conductive layer 15, 25 attenuates the strength of the unwanted electromagnetic field. In addition to acting as a shield, both the first conductive layer 15 and second conductive layer 25 act as antennas and reflect some of the waves of the field back towards the source of the unwanted electromagnetic radiation, which is shown in FIG. 9. Thus, first conductive layer 15 reflects some of the waves of the field back towards the source of the field. This causes some of the electromagnetic field reflected by first conductive layer 15, through interference, to cancel out some of the external field.

Likewise, second conductive layer 25 reflects some of the waves of the field that passed through first conductive layer 15 back towards insulating layer 20 and the first conductive layer 15. As described above, the first conductive layer 15, the insulating layer 20 and the second conductive layer define a wave-guide. This causes an electromagnetic field to be emitted coplanar with the shield 10. For simplicity, this is not shown in FIG. 9. In addition, some of the waves of the electromagnetic field are reflected by the second conductive layer 25 back towards the first conductive layer 15. Some of these waves are then reflected back towards the second conductive layer 25, i.e., the waves resonate. Just as described above, when the waves of the field are resonating between the first conductive layer 15 and the second conductive layer 25, the magnitude of the electrostatic potential of the field that passes through the second conductive layer 25, and hence is communicated to the electronic device 30, is attenuated. This is because the waves of the field resonating between the first conductive layer 15 and the second conductive layer 25 interfere with, i.e., cancel, the waves of the external electromagnetic field. These mechanisms act to reduce the amount of electromagnetic radiation that reaches the electronic device 30.

Figure 10:
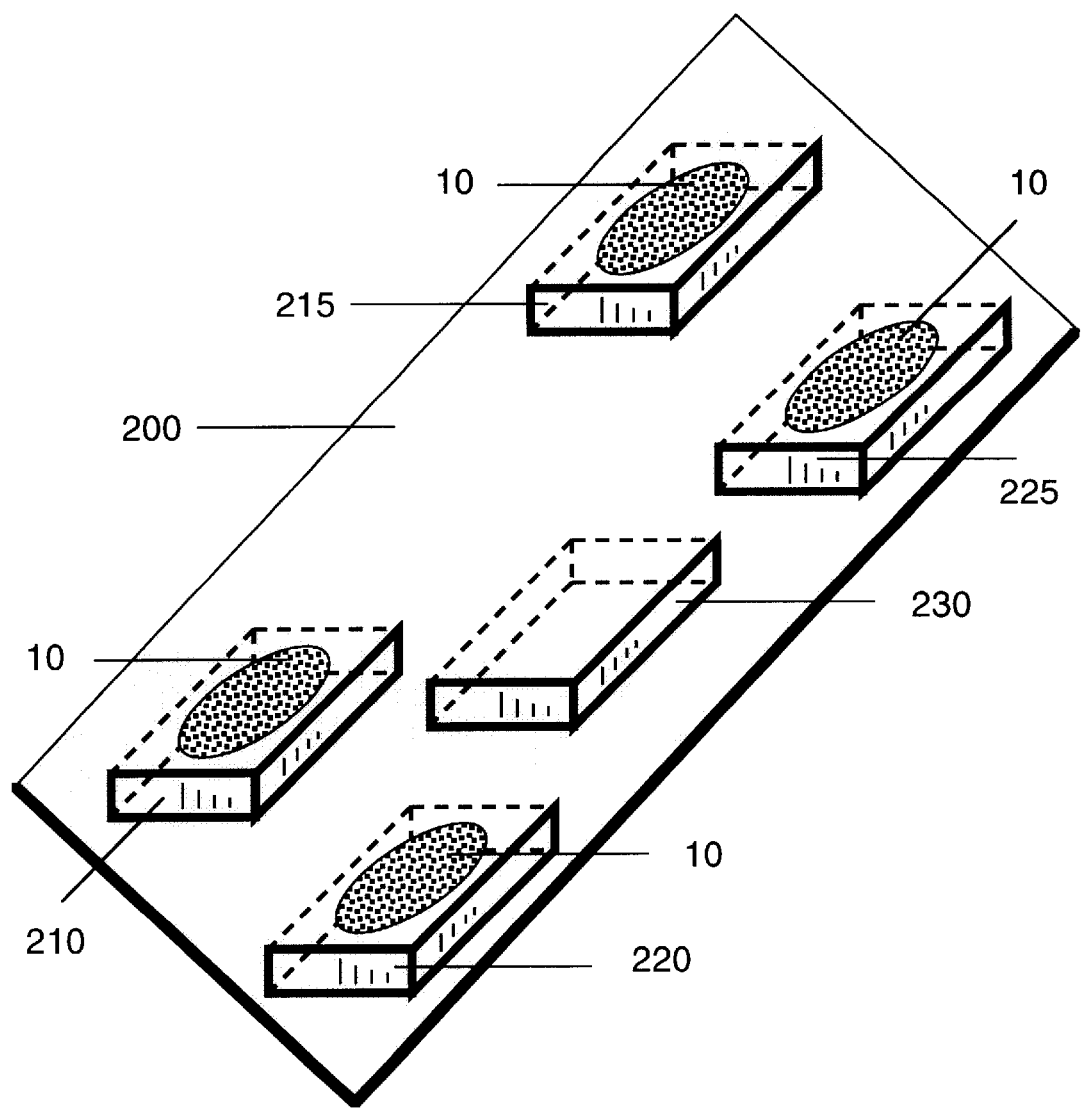
FIG. 10 shows an example of a printed circuit board having electromagnetic shields of the present invention installed on several of the electronic components located thereon.

FIG. 10 shows a printed circuit board 200 having various electronic components 210, 215, 220, 225, 230 installed thereon. When the product that utilizes this printed circuit board 200 is tested for stray electromagnetic emissions and fails, the emissions from each of the electronic components 210, 215, 220, 225, 230 can be measured using an antenna that communicates with a spectrum analyzer or other type of device, as discussed above. In addition, whereas a spectrum analyzer can reveal specific frequencies and specific magnitudes of the stray electromagnetic fields, it is possible to use a receiver that tunes to a specific frequency from which the magnitude can be derived. This allows testing of specific frequencies, should that be necessary. Shields 10 of the present invention can be installed on those components that are emitting excessive levels of electromagnetic radiation. According to most specifications (see above) most countries will not allow the shipment, sale or marketing of digital devices without first being tested to ensure that they have levels of electromagnetic radiation below 40 dB microvolts per meter at 30 MHz when measured at 3.0 meters. For example, for the printed circuit board 200 shown in FIG. 10, shields 10 where installed on electronic components 210, 215, 220, 225, but not on electronic component 230.

Figure 11:
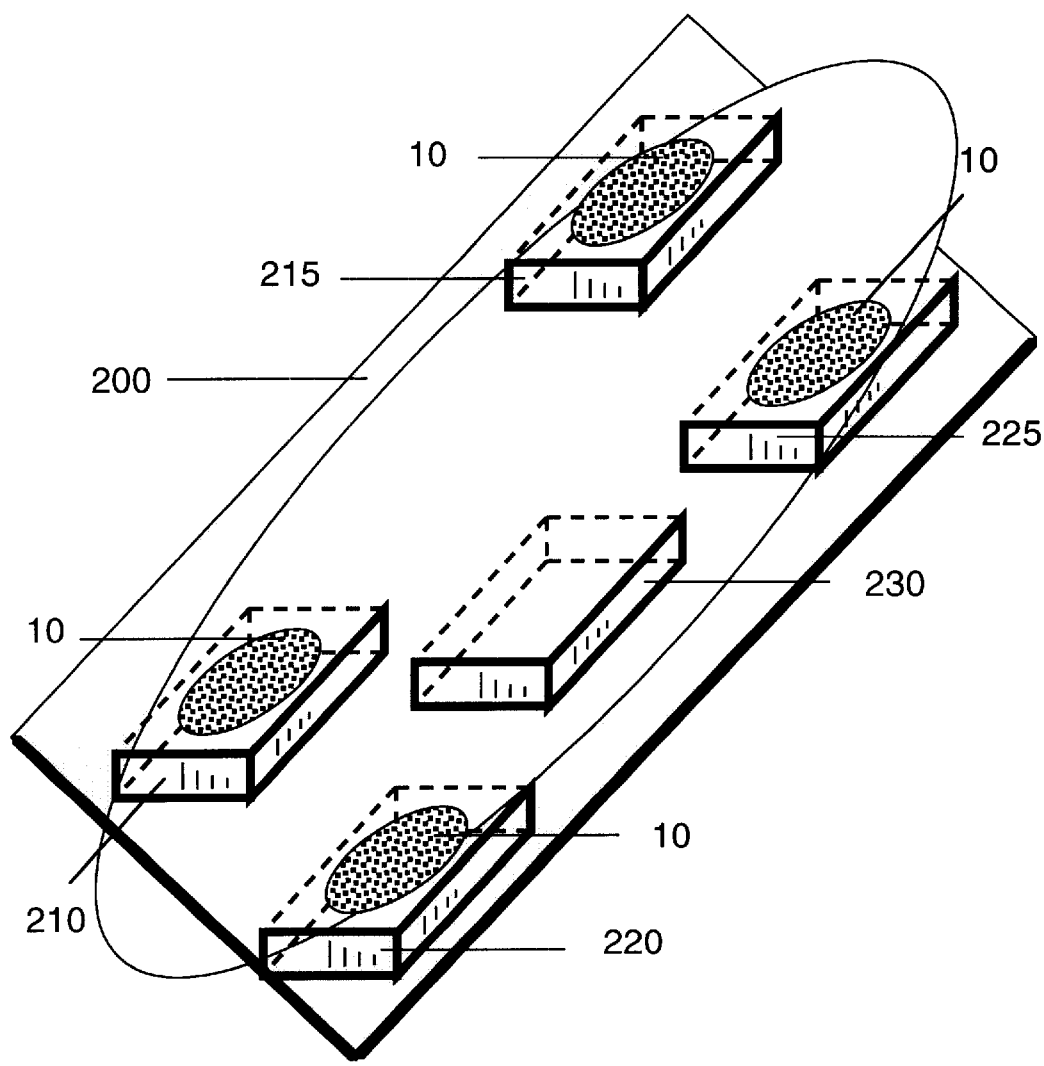
FIG. 11 shows an example of a printed circuit board having electromagnetic shields of the present invention installed on several of the electronic components located thereon and the field created by the installation of the shields.
Figure 12:
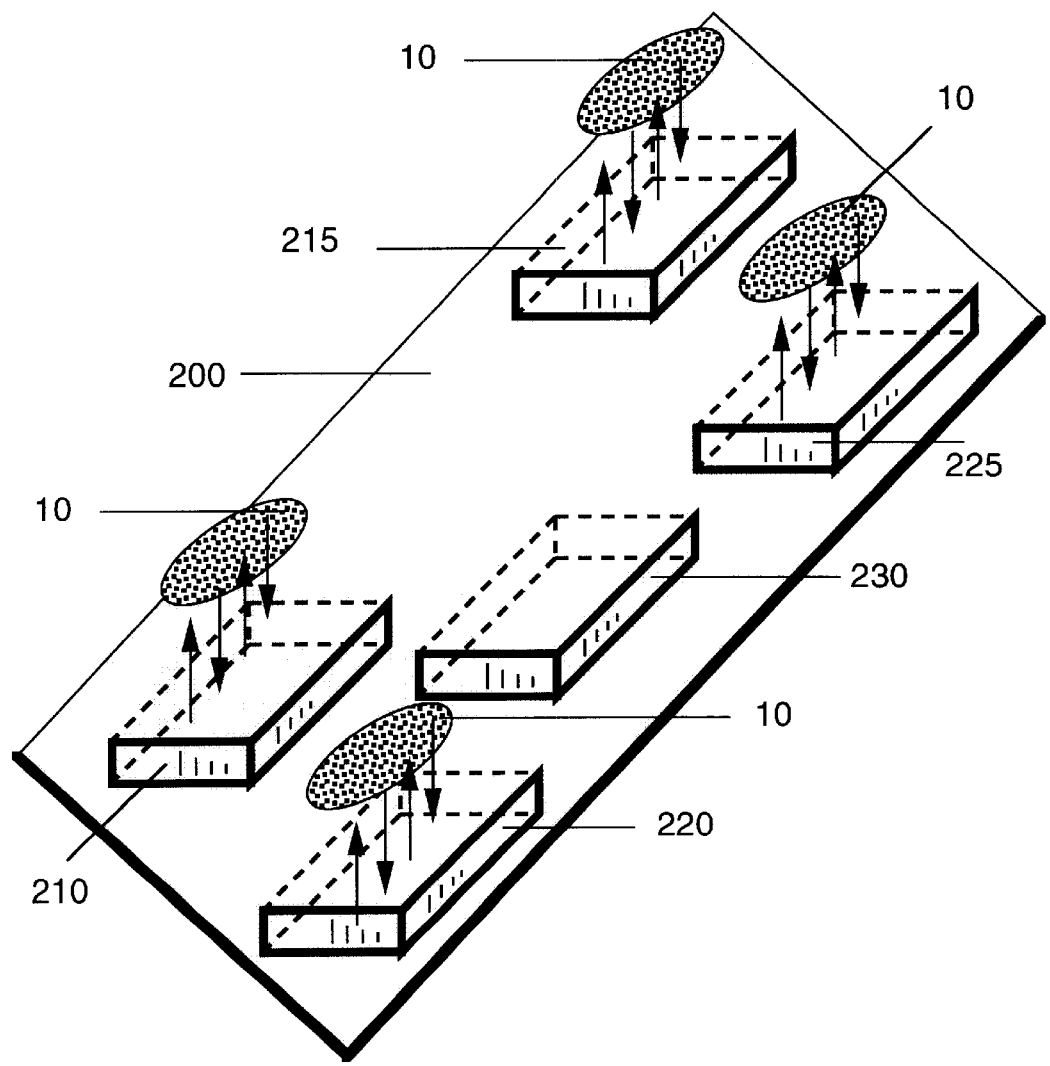
FIG. 12 is a simplified drawing showing an effect of the stray electromagnetic shield of the present invention when in the vicinity of electronic components located thereon.

As in the case of printed circuit board 200, it may not be necessary to place a shield 10 on every electronic component that is emitting excessive amounts of electromagnetic radiation. It is only necessary to install shields 10 on enough components such that the emissions from the product fall within those allowed by the regulations of the country where the product will be sold. It is necessary, however, to carefully select which components the shields 10 will be installed on. The reason for this is as follows. As discussed, the shields 10 themselves produce electromagnetic fields of their own (generally in the same plane as the shields). These fields will interact with the fields created by the shields 10 installed on the other electronic components. Indeed, the interaction of the fields created by the shields 10 that are installed on the electronic components may aid in collapsing the fields created by an electronic component that does not have a shield installed thereon. An example of this interaction is seen in FIG. 11, which shows the electromagnetic field created when shields 10 are installed on electronic components 210, 215, 220, 225. Furthermore, depending upon the application, it may be desirable to install a shield 10 on only the electronic devices that are emitting the most electromagnetic radiation.

Shields 10 like those described herein have been constructed and have attenuated the electromagnetic radiation emissions from an integrated circuit by anywhere from three to twenty dB microvolts in a frequency range of 30 to 1000 MHz.

Figure 13:
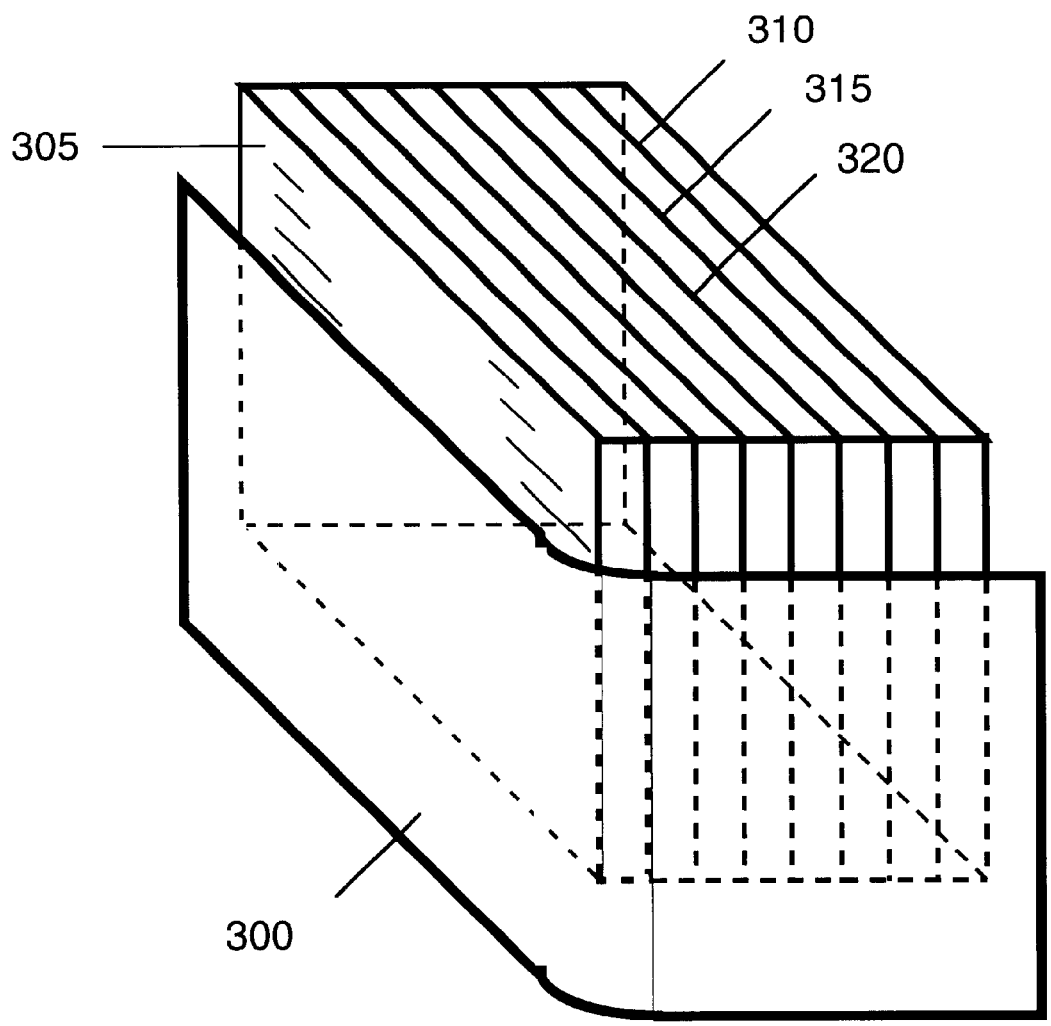
FIG. 13 is a simplified perspective drawing showing a shield of the present invention installed in a curvilinear fashion.

Another embodiment of the present invention will be discussed with reference to FIGS. 13–14. The embodiment of the present invention shown in FIGS. 13–14 utilizes a shield 300 oriented in a curvilinear fashion. In the example of FIG. 13, a shield 300 of the present invention is installed in a curvilinear fashion on a printed circuit board card cage 305 to reduce unwanted electromagnetic radiation emissions emanating therefrom. Shield 300 is constructed as described above. Shield 300, however, is generally larger than the shields described above, in that shield 300 is designed to be installed over brackets and printed circuit boards, not a single electronic component.

As is seen in FIG. 13, the shield 300 is installed on card cage 305 such that it curves around card cage 305 at a substantially ninety-degree angle. Card cage 305 contains any number of printed circuit board assemblies 310, 315, and 320. It is noted that redundant printed circuit boards are not shown in FIG. 13. In general, the chassis of a card cage 305 is constructed from rigid metal or plastic of sufficient strength to hold the printed circuit boards 310, 315, 320 in place. For illustrative purposes, the shield 300 of the present invention is shown such that it is slightly removed from the surface of the card cage. In a normal application, however, the shield 300 is placed directly on the card cage surface. By installing a shield 300 of the present invention in such a curvilinear fashion, the unwanted electromagnetic radiation emissions are effectively moved from the front of the card cage to the side. In this example, the front of the card cage consists of vertical printed circuit boards seen readily in this view, perpendicular to a horizontal plane and perpendicular to the invention.

Figure 14:
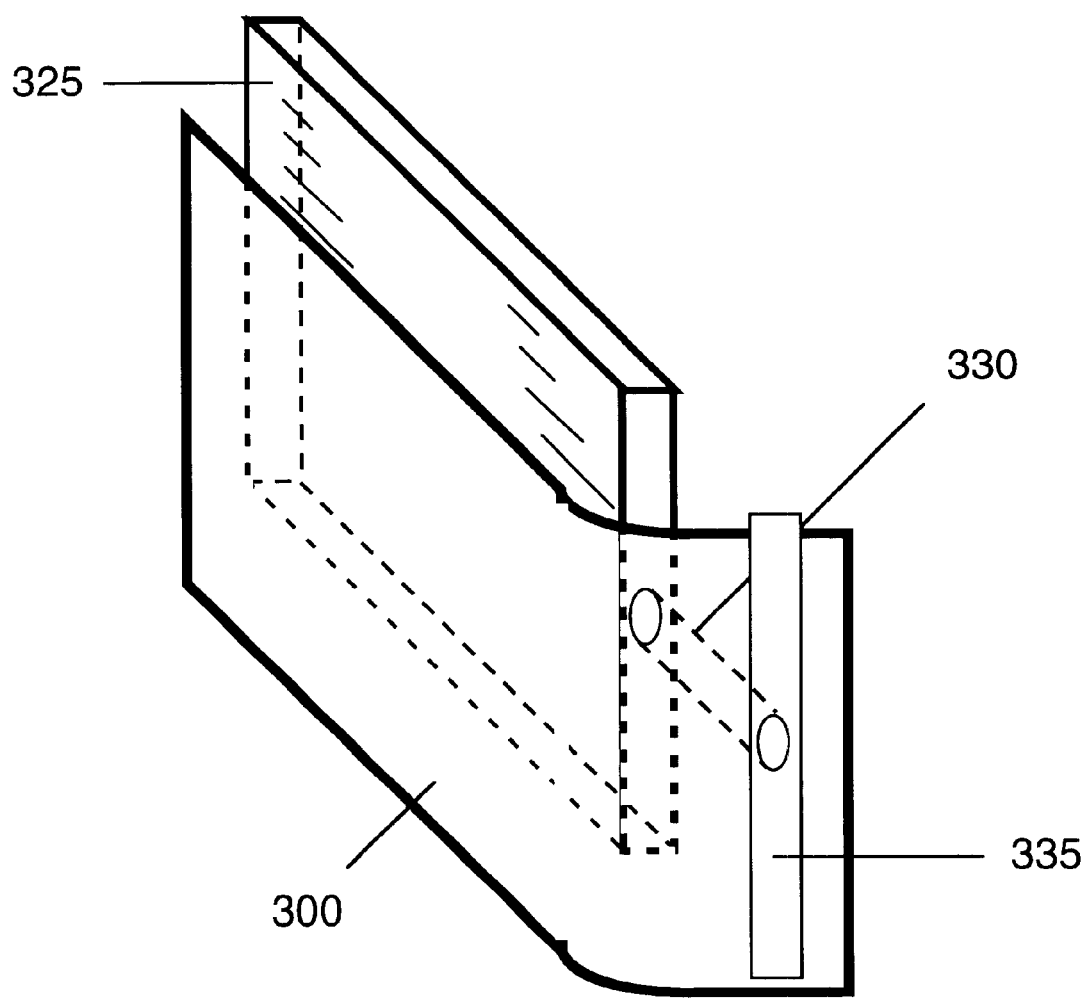
FIG. 14 is a simplified perspective drawing showing a shield of the present invention installed in a curvilinear fashion.

In the example shown in FIG. 14, a shield 300 is installed to reduce unwanted emissions on a cable connected to a printed circuit board. An example of a cable that can emit unacceptable amplitudes of unwanted emissions include a composite video cable that is connected to a personal computer. A typical personal computer contains a number of printed circuit boards, e.g., printed circuit boards 310, 315, 320 (see FIG. 13), that are fastened to the chassis with a retaining bracket (not shown in FIG. 13). These retaining brackets are used to stabilize the printed circuit boards and hold them in place. As is seen in FIG. 14, the metal bracket 335 traverses the entire length of the printed circuit board 325 that faces the exterior of the personal computer. In general, the bracket 335 is connected to the printed circuit board 325 in two places (these connections are not shown in order to simplify the drawing). Passing through the metal bracket, however, is the composite video port 330. The outside surface of the metal bracket 335 is usually in contact with the chassis guides (not shown) of the personal computer.

To reduce the unwanted emissions from the cable (not shown), a shield 300 constructed in accordance with the present invention is installed in a curvilinear fashion such that it covers the inside of the bracket 335 (i.e., the shield 300 is disposed between the printed circuit board 325 and bracket 335). The shield 300 then turns at a substantially ninety-degree angle such that it traverses a predetermined length of the side of the printed circuit board 325 which has the electronic components installed thereon. In various preferred embodiments, this predetermined length should be at least two inches. The port 330 passes through the shield 300. Thus, the shield 300 of the present invention must have an aperture (not shown) disposed therein to allow the port to pass therethrough.

It is important to note that the shield 300 may or may not electrically conductively contact the metal bracket of the printed circuit board 325. Spectrum analyzer measurements are taken to determine the effectiveness of conductive contact with the retaining bracket. If measurements determine that conductive contact did provide satisfactory attenuation, the shield 300 can then be installed in a non-conductive manner. Furthermore, the shield 300 in FIG. 14 is normally in contact the electronic components mounted on the component side of the printed circuit board 325. It is noted that the retaining bracket 335 shown in FIG. 14 is shown removed from the printed circuit board 325 to allow viewing for clarification of the inventive concepts shown therein.

Thus, a preferred apparatus for attenuating stray electromagnetic radiation emitted by electronic devices, and the method manufacturing and using the apparatus has been described. While embodiments and applications of this invention have been shown and described, as would be apparent to those skilled in the art, many more embodiments and applications are possible without departing from the inventive concepts disclosed herein. The invention, therefore, is not to be restricted except in the spirit of the appended claims.

I claim:

1. An electromagnetic shield which can be affixed to an electronic component comprising:
    a topmost layer;
    a first conductive layer disposed beneath said topmost layer;
    an insulating layer disposed beneath said first conductive layer, said first conductive layer comprising:
        (a) a first semiconductor layer;
        (b) a fibrous layer disposed beneath said first semiconductor layer;
        (c) a second semiconductor layer disposed beneath said fibrous layer;
    a second conductive layer disposed beneath said insulating layer;
    an inner layer disposed beneath said second conductive layer; and
    an adhesive layer disposed beneath said inner layer.

2. The shield of claim 1 wherein said topmost layer and said inner layer comprise a polyester material.

3. The shield of claim 1 wherein said topmost layer and said inner layer comprise a lacquer material.

4. The shield of claim 1 wherein said first conductive layer and said second conductive layer comprise an aluminum alloy.

5. The shield of claim 1 wherein said first semiconductor layer and said second semiconductor layer comprise a paraffin-based resin glue.

6. The shield of claim 1 wherein said shield has a cornerless shape.

* * * * *